United States Patent
Baker

(10) Patent No.: US 8,942,006 B2
(45) Date of Patent: Jan. 27, 2015

(54) PCB STACKUP HAVING HIGH- AND LOW-FREQUENCY CONDUCTIVE LAYERS AND HAVING INSULATING LAYERS OF DIFFERENT MATERIAL TYPES

(71) Applicant: International Business Machines Corporation, Armonk, NY (US)

(72) Inventor: Anthony E. Baker, Stittsville (CA)

(73) Assignee: Lenovo Enterprise Solutions (Singapore) Pte. Ltd., New Tech Park (SG)

(*) Notice: Subject to any disclaimer, the term of this patent is extended or adjusted under 35 U.S.C. 154(b) by 182 days.

(21) Appl. No.: 13/745,780

(22) Filed: Jan. 19, 2013

(65) Prior Publication Data
US 2014/0204546 A1    Jul. 24, 2014

(51) Int. Cl.
| H05K 1/14 | (2006.01) |
| H05K 1/11 | (2006.01) |
| H05K 1/02 | (2006.01) |
| H05K 1/18 | (2006.01) |
| H05K 3/00 | (2006.01) |

(52) U.S. Cl.
CPC .............. H05K 1/0237 (2013.01); H05K 1/181 (2013.01); H05K 3/0058 (2013.01)
USPC ............................. 361/794; 361/760; 174/251

(58) Field of Classification Search
USPC .................................. 361/794, 760; 174/251
See application file for complete search history.

(56) References Cited

U.S. PATENT DOCUMENTS

| 6,936,498 | B2 | 8/2005 | Survakumar |
| 8,687,380 | B2* | 4/2014 | Aoyama et al. ............... 361/795 |
| 8,704,104 | B2* | 4/2014 | Hilbers et al. ............... 174/261 |
| 2010/0229067 | A1 | 9/2010 | Ganga et al. |
| 2011/0115080 | A1 | 5/2011 | Wakisaka |
| 2011/0303445 | A1 | 12/2011 | Cases et al. |
| 2012/0054469 | A1 | 3/2012 | Ikeya et al. |

FOREIGN PATENT DOCUMENTS

| JP | 2004-214271 | 7/2004 |
| JP | 2005-116811 | 4/2005 |

OTHER PUBLICATIONS

"PCB Stackup Design Considerations for Altera FPGAs", Altera Corp., AN-613-1.0 Application Note; Oct. 2010, See pp. 4, 5, 21 in particular.
M. Orzech, "DDI Technology PCB Laminate Materials", DDi_PCB_Materials_Primer; SMTA-Houston/GC Chapter; Nov. 9, 2010.

* cited by examiner

*Primary Examiner* — Andargie M Aychillhum
(74) *Attorney, Agent, or Firm* — Katherine Brown

(57) ABSTRACT

A printed circuit board (PCB) stackup includes conductive layers and insulating layers interleaved among the conductive layers. The conductive layers include one or more power layers, one or more ground layers, one or more high-frequency layers, and one or more low-frequency layers. One or more first signals having one or more first frequencies greater than a first threshold are communicated over the high-frequency layers. One or more second signals having one or more second frequencies less than a second threshold are communicated over the low-frequency layers. Each second frequency is less than each first frequency. The insulating layers include one or more core layers and one or more prepreg layers arranged in alternating fashion. Each insulating layer adjacent to any high-frequency layer has a first material type. Each insulating layer not adjacent to any high-frequency layer has a second material type different than the first material type.

19 Claims, 5 Drawing Sheets

PCB STACKUP HAVING HIGH- AND LOW-FREQUENCY CONDUCTIVE LAYERS AND HAVING INSULATING LAYERS OF DIFFERENT MATERIAL TYPES

BACKGROUND

An electronic device usually includes one or more electronic components mounted to a printed circuit board (PCB). A PCB includes conductive layers to provide power and ground to the electronic components and to communicate signals among the electronic components. Traditionally PCBs have included a single insulating layer on which conductive layers were provided at the top and/or bottom thereof. More recently, PCBs have begun to have multiple layers in so-called PCB stackups, in which there are multiple conductive layers and multiple insulating layers interleaved among the conductive layers, so that more complex and sophisticated electronic devices can be fashioned in a minimum of area.

SUMMARY

A printed circuit board (PCB) stackup of an embodiment of the disclosure includes conductive layers and insulating layers interleaved among the conductive layers. The conductive layers include one or more power layers, one or more ground layers, one or more high-frequency layers, and one or more low-frequency layers. One or more first signals having one or more first frequencies greater than a first threshold are communicated over the high-frequency layers. One or more second signals having one or more second frequencies less than a second threshold are communicated over the low-frequency layers. Each second frequency is less than each first frequency. The insulating layers include core layers and prepreg layers arranged in alternating fashion. Each insulating layer adjacent to any of the high-frequency layers has a first material type, and each insulating layer not adjacent to any of the high-frequency layers has a second material type different than the first material type.

A method for fabricating a PCB stackup of an embodiment of the disclosure includes providing one or more core layers, which are insulating layers, and where each core layer has a conductive layer attached to each side thereof. The method includes arranging prepreg layers, which are also insulating layers, in relation to the core layers in alternating fashion. The insulating layers include a top-most insulating layer above which no other insulating layer is disposed and a bottom-most insulating layer below which no other insulating layer is disposed. The insulating layers are interleaved among the conductive layers. The method includes disposing a top-most conductive layer above the top-most insulating layer and a bottom-most conductive layer below the bottom-most insulating layer. The method includes applying pressure between the top-most conductive layer and the bottom-most conductive layer and applying heat to the insulating layers and the conductive layers to bind the insulating layers and the conductive layers to one another, which results in the PCB stackup being fabricated.

In the method, the conductive layers include one or more power layers, one or more ground layers, one or more high-frequency layers, and one or more low-frequency layers. One or more first signals having one or more first frequencies greater than a first threshold are communicated over the high-frequency layers, and one or more second signals having one or more second frequencies less than a second threshold are communicated over the low-frequency layer. Each second frequency is less than each first frequency. Also in the method, each insulating layer adjacent to any of the high-frequency layers has a first material type, and each insulating layer not adjacent to any of the high-frequency layers has a second material type different than the first material type.

A method of another embodiment of the disclosure includes providing a PCB stackup include conductive layers and insulating layers interleaved among the conductive layers. The insulating layers include one or more core layers and prepreg layers arranged in alternating fashion. The method includes attaching one or more electronic components to the PCB stackup to fabricate an electronic device that includes the PCB stackup and the electronic components.

In this method, too, the conductive layers include one or more power layers, one or more ground layers, one or more high-frequency layers, and one or more low-frequency layers. One or more first signals having one or more first frequencies greater than a first threshold are communicated over the high-frequency layers, and one or more second signals having one or more second frequencies less than a second threshold are communicated over the low-frequency layer. Each second frequency is less than each first frequency. Also in this method, each insulating layer adjacent to any of the high-frequency layers has a first material type, and each insulating layer not adjacent to any of the high-frequency layers has a second material type different than the first material type.

An electronic device of an embodiment of the disclosure includes a PCB stackup including conductive layers and insulating layers interleaved among the conductive layers. The insulating layers include one or more core layers and one or more prepreg layers arranged in alternating fashion. The electronic device includes one or more electronic components attached to the PCB stackup.

In the electronic device, the conductive layers include one or more power layers, one or more ground layers, one or more high-frequency layers, and one or more low-frequency layers. One or more first signals having one or more first frequencies greater than a first threshold are communicated over the high-frequency layers, and one or more second signals having one or more second frequencies less than a second threshold are communicated over the low-frequency layer. Each second frequency is less than each first frequency. Also in the electronic device, each insulating layer adjacent to any of the high-frequency layers has a first material type, and each insulating layer not adjacent to any of the high-frequency layers has a second material type different than the first material type.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As noted in the background section, a printed circuit board (PCB) stackup includes multiple conductive layers and multiple insulating layers interleaved among the conductive layers. The conductive layers can include one or more power layers, one or more ground signals, and multiple signal layers. The insulating layers can include core layers and prepreg layers arranged in alternating fashion. Such a PCB stackup permits different signals to be transported on different layers.

In some electronic devices using PCB stackups, the different signals include high-frequency signals and low-frequency signals. High-frequency signals typically require that a PCB stackup have insulating layers of a better material type than low-frequency signals do. This can exacerbate manufacturing cost, because the better material type of such insulating layers is generally more expensive.

Disclosed herein are techniques to minimize the extra cost involved in manufacturing PCB stackups within which both high- and low-frequency signals are transported. In particular, just the insulating layers adjacent to signal layers over which high-frequency signals are communicated are of the better and usually more expensive material type. That is, each insulating layer adjacent to a signal layer over which a high-frequency signal is communicated is of a first material type, and each insulating layer adjacent to a signal layer over which a low-frequency signal is communicated is of a different, second material type. This ensures that the potentially more expensive insulating layers are used only where necessary.

For a given thickness, a given laminate construction, and a given frequency rating, the first material type has a lower dielectric constant and/or a lower dielectric dissipation factor than the second material type. An example of such a first material type is that sold under the trade name Megtron 6®, which is a polyphenylene ether (PPE) blend resin available from Panasonic Corporation of Santa Ana, Calif. An example of such a second material type is that sold under the trade name Megtron 4®, which is a functionalized polyphenylene oxide (PPO)/epoxy blend also available from Panasonic. The trade names Megtron 4® and Megtron 6® are registered trademarks of Panasonic.

Figure 1:
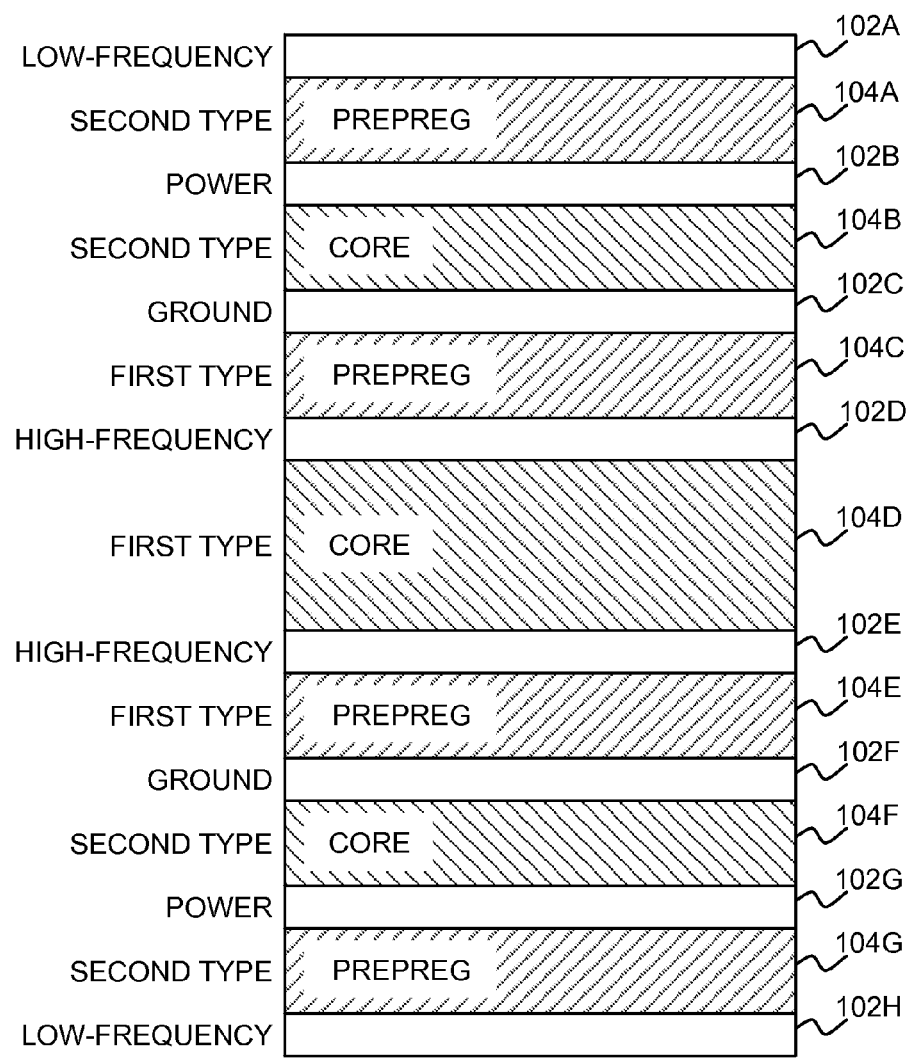
FIG. 1 is a diagram of an example printed circuit board (PCB) stackup.
Figure 2:
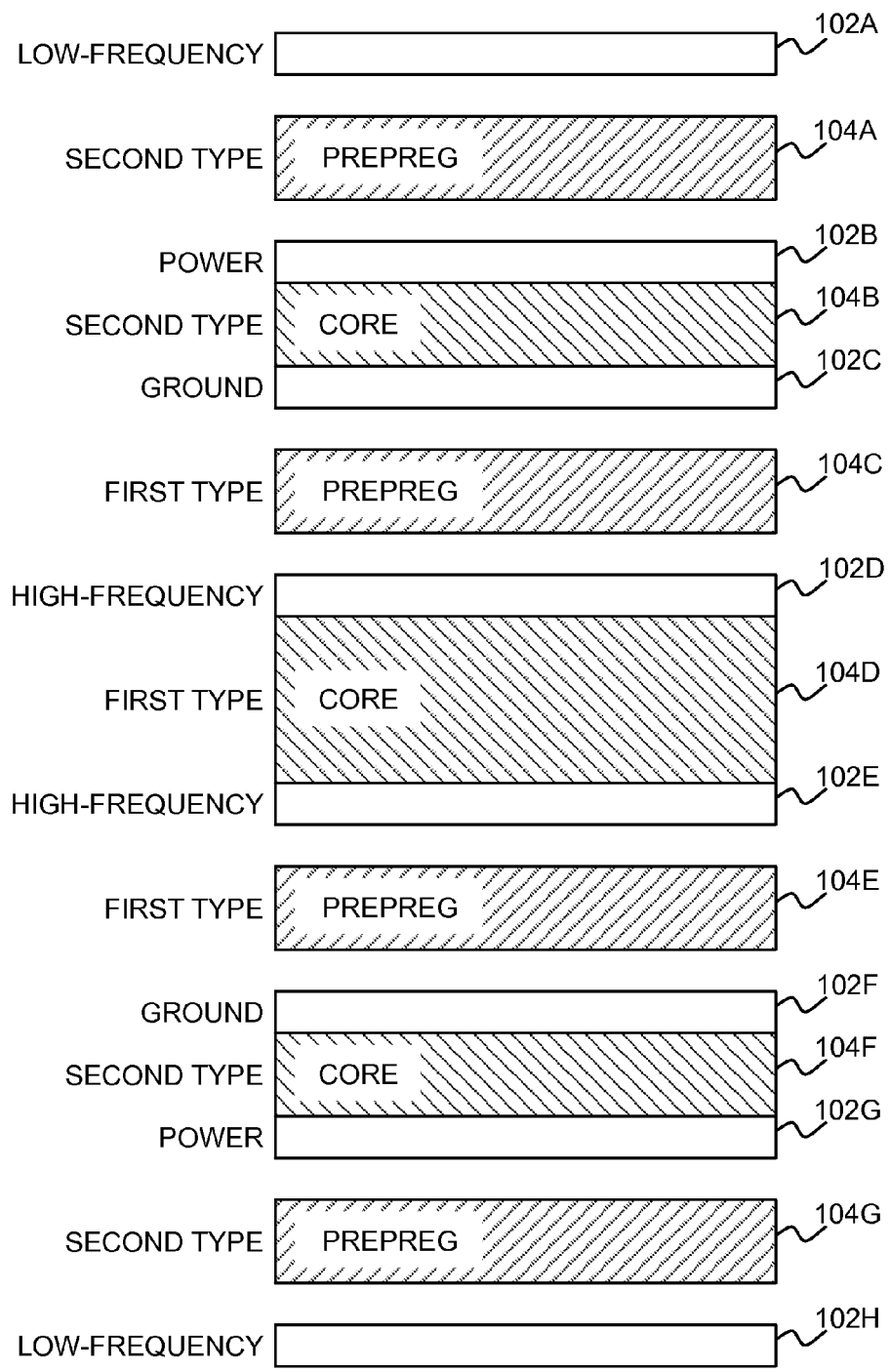
FIG. 2 is a diagram of an example PCB stackup in exploded perspective.

FIGS. 1 and 2 show one example PCB stackup 100. The difference between FIGS. 1 and 2 is that FIG. 2 shows the PCB stackup 100 in exploded fashion, which illustrates how various layers are provided prior to final fabrication of the stackup 100. The example PCB stackup 100 includes eight conductive layers 102A, 102B, 102C, 102D, 102E, 102F, 102G, and 102H, which are collectively referred to as the conductive layers 102. The example PCB stackup 100 includes seven non-conductive, insulating layers 104A, 104B, 104C, 104D, 104E, 104F, 104G, and 104H, which are collectively referred to as the insulating layers 104. The insulating layers 104 are interleaved among the conductive layers 102, and in general no insulating layer 104 is immediately adjacent to another insulating layer 104 and no conductive layer 102 is immediately adjacent to another conductive layer 102.

The example PCB stackup 100 is an eight-layer stackup, because the number of layers to which a stackup is referred is equal to the number of conductive layers 102. While there are eight conductive layers 102 in the example PCB stackup 100, in general there may be an even number of such conductive layers 102, and typically there are at least four such conductive layers 102. The top-most conductive layer 102A is typically the top-most layer of the PCB stackup 100 as a whole and the bottom-most conductive layer 102B is typically the bottom-most layer of the stackup 100 as a whole, not including any solder mask or other layers that are not depicted in FIGS. 1 and 2. Because of this, and because the insulating layers 104 are interleaved among the conductive layers 102, there is thus usually then an odd number of such insulating layers 104. In general, the number of insulating layers 104 is equal to the number of conductive layers, minus one. It is noted that where solder mask layers are present, even though technically such layers are insulating layers, they are not considered part of the insulating layers 104 per se, which are defined as including just prepreg layers 104 and core layers 104, as described in more detail later in the detailed description.

The conductive layers 102 each may be a metal like copper, and may be a foil layer like a copper foil layer. The conductive layers 102 in the example PCB stackup 100 include low-frequency layers 102A and 102H, high-frequency layers 102D and 102E, power layers 102B and 102G, and ground layers 102C and 102F. However, in general, there is at least one low-frequency layer 102, at least one high-frequency layer 102, at least one power layer 102, and at least one ground layer 102. The configuration as to which conductive layer 102 is a low-frequency layer, which conductive layer 102 is a high-frequency layer, which conductive layer 102 is a power layer, and which conductive layer 102 is a ground layer can also vary from the configuration depicted in FIGS. 1 and 2. The example PCB stackup 100 in this and other respects, in other words, is just that—an example of a PCB stackup.

The low-frequency layers 102A and 102H and the high-frequency layers 102D and 102E are signal layers over which data and other types of signals are communicated. Low-frequency signals are communicated over the low-frequency layers 102A and 102H, and high-frequency signals are communicate over the high-frequency layers 102D and 102E. For example, the high-frequency signals can include twenty-five (or more) gigabytes-per-second (GBps) signals, whereas the low-frequency signals can include ten (or less) GBps signals. As another example, the high-frequency signals can include ten (or more) GBps signals, whereas the low-frequency signals can include one (or less GBps signals). In general, the high-frequency signals have high frequencies defined as greater than a specified high-frequency threshold, whereas the low-frequency signals have low frequencies defined as less than a specified low-frequency threshold that is less than the specified high-frequency threshold.

The power layers 102B and 102G provide power, such as constant or variable direct current (DC) and/or alternating current (AC). The ground layers 102C and 102F provide connection to ground, such as earth ground or a floating or other type of ground, like analog ground and/or digital ground. Electronic components attached to the PCB stackup 100 thus can communicate with one another over the signal layers 102A, 102D, 102E, and/or 102H, receive power over the power layers 102B and/or 102G, and connect to ground via the ground layers 102C and/or 102F. Appropriate vias, or through-holes, and mounting pads may be included on the PCB stackup 100 for such purposes, for instance.

The insulating layers 104 include prepreg layers 104A, 104C, 104E, and 104G, and core layers 104B, 104D, and 104F arranged in alternating fashion. As such, no two prepreg layers 104A, 104C, 104E, and 104G are immediately opposite the same conductive layer 102, and likewise no two core layers 104B, 104D, and 104G are immediately opposite the same conductive layer 102. The difference between the prepreg layers 104A, 104C, 104E, and 104G and the core layers 104B, 104D, and 104F can include one or more of the following, among other distinctions. The core layers 104B, 104D, and 104F are typically cured before final fabrication of the PCB stackup 100, whereas the prepreg layers 104B, 104D, and 104F are typically uncured until final fabrication of the stackup 100.

The core layers 104B, 104D, and 104F prior to final fabrication of the PCB stackup 100 each have two conductive layers 102 securably attached thereto (such as via bonding) on sides thereof, where the curing of the core layers 104B, 104D, and 104F is thus what adheres these conductive layers 102 thereto. By comparison, prior to final fabrication of the PCB stackup 100, the prepreg layers 104A, 104C, 104E, and 104G do not have any conductive layers 102 securably attached thereto. This is why in the exploded view of FIG. 1, there are gaps between the prepreg layers 104A, 104C, 104E, and 104G and their adjacent conductive layers 102, whereas there are no gaps between the core layers 104B, 104D, and 104F and their adjacent conductive layers 102.

The core layers 104B, 104D, and 104F can each be a cured fiberglass-epoxy resin layer having at least one conductive layer 102 bonded to each side thereof (via such curing). By comparison, the prepreg layers 104A, 104C, 104E, and 104G can each be an uncured fiberglass-epoxy resin layer that is cured upon application of pressure and heat during final fabrication of the PCB stackup 100. Each core layer 104B, 104D, and 104F can be a fiberglass reinforced epoxy laminate layer, for instance, whereas each prepreg layer 104A, 104C, 104E, and 104G can be a fiber-weave layer preimpregnated with a resin bonding agent.

While three core layers 104B, 104D, and 104F are depicted in FIGS. 1 and 2, the core layers 104B, 104D, and 104F can more generally be said to be odd in number in the example represented by FIGS. 1 and 2. Similarly, while four prepreg layers 104A, 104C, 104E, and 104G are depicted in FIGS. 1 and 2, in general the prepreg layers 104A, 104C, 104E and 104G can more generally be said to be even in number in the example represented by FIGS. 1 and 2. Note that because an odd number plus an even number is equal to an odd number, this results in the number of insulating layers 104 itself being odd, consistent with the description above.

In the example of FIGS. 1 and 2, the core layer 104D is the central insulating layer 104 that is the middle layer of the PCB stackup 100. The central core layer 104D can be thicker than any other insulating layer 104 in the example of FIGS. 1 and 2, for structural integrity of the PCB stackup 100, for instance. The other core layers 104B and 104F may be equal in thickness to the prepreg layers 104A, 104C, 104E, and 104G. However, in another configuration, the central core layer 104D can be thinner than any other insulating layer 104, to ensure better embedded capacitance, for instance. The insulating layers 104 themselves are typically thicker than the conductive layers 102. The PCB stackup 100 can be symmetrical about the central core layer 104D, also for structural integrity. For instance, proceeding upwards from the central core layer 104D are four conductive layers 102 interleaved with three insulating layers 104. Likewise, proceeding downwards from the central core layer 104D are four conductive layers 102 interleave with three insulating layers 104.

Each of the insulating layers 104C, 104D, and 104E immediately adjacent to one of the high-frequency layers 102D and 102E is of a first material type, whereas each of the other insulating layers 104A, 104B, 104F, and 104G not immediately adjacent to one of the high-frequency layers 102D and 102E is of a second material type different than the first material type. The first material type is the better and usually more expensive material as compared to the second material type, to support high-frequency signals being communicated over the high-frequency layers 102D and 102E. For instance, for a given thickness, a given laminate construction, and a given frequency rating, the first material type has a lower dielectric constant and/or a lower dielectric dissipation factor than the second material type. An example of the first material type is that which is available under the trade name Megtron 6®, whereas an example of the second material type is that which is available under the trade name Megtron 4®.

Figure 3:
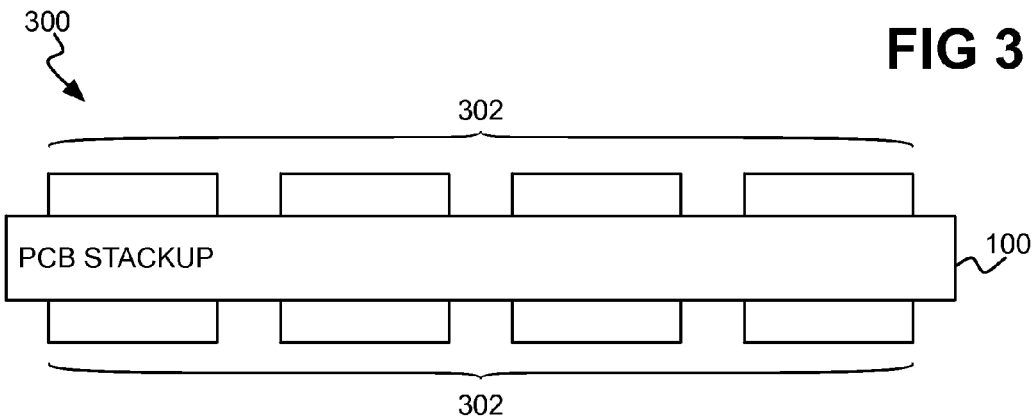
FIG. 3 is a diagram of an example electronic device including a PCB stackup.

FIG. 3 shows an example electronic device 300. The electronic device 300 can be a networking device, like a router, another type of computing device, or another type of electronic device. The electronic device 300 includes the PCB stackup 100. One or more electronic components 302 are mounted on or otherwise attached to either or both sides of the PCB stackup 100, such as via soldering, and so on. The electronic components 302 can include integrated circuits (ICs), more basic components like resistors, capacitors, and inductors, as well as other types of electronic components.

Figure 4:
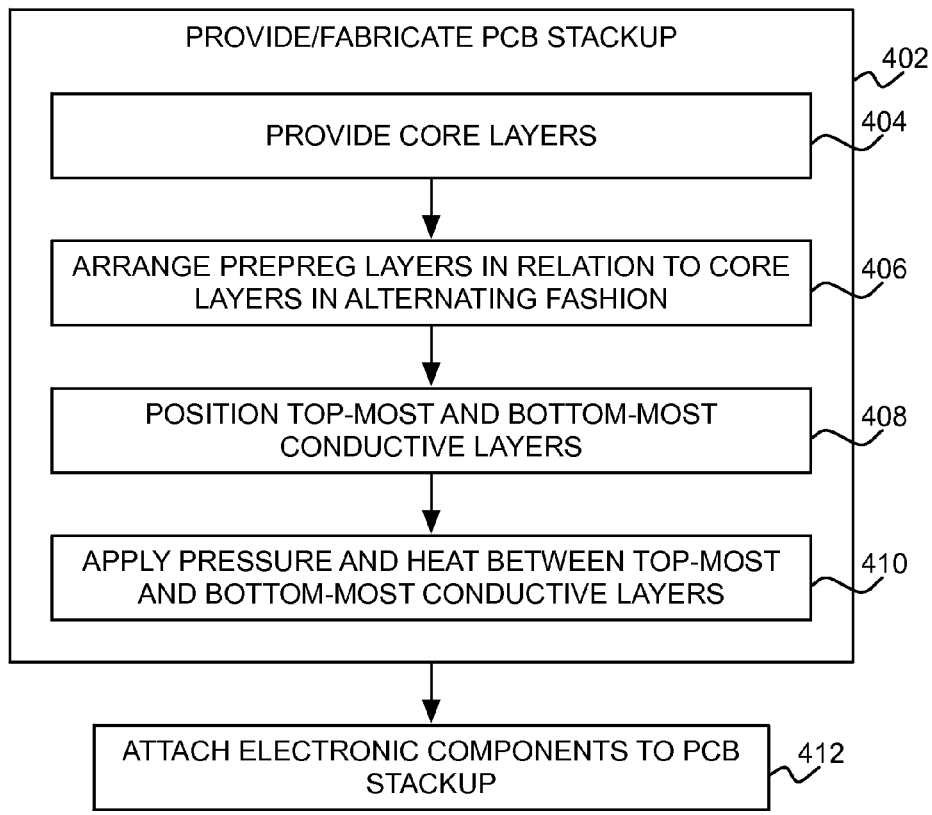
FIG. 4 is a flowchart of an example method for fabricating an example electronic device, including fabricating an example PCB stackup.

FIG. 4 shows an example method 400. The method 400 depicts a general approach to fabricate the example electronic device 300, and a specific approach to fabricate the example PCB stackup 100. In general, PCB stackup 100 is provided (402), such as via being initially fabricated, and then the electronic components 302 are attached to the PCB stackup 100 (404), to realize (i.e., fabricate) the electronic device 300.

Providing of the PCB stackup 100 can include fabricating the stackup 100, as follows. The core layers 104B, 104D, and 104F are provided (404). Each core layer 104B, 104D, and 104F is provided as having its adjacent conductive layers 102B and 102C, 102D and 102E, and 102F and 102G, respectively, already attached thereto. For instance, the core layers 104B, 104D, and 104F can be fabricated beforehand, by applying the conductive layers 102B and 102C, 102D and 102E, and 102F and 102G, respectively, thereto, and curing the resulting assemblies to bond the latter to the former.

The prepreg layers 104A, 104C, 104E, and 104G are arranged in relation to the core layers 104B, 104D, and 104F in alternating fashion (406). In the example PCB stackup 100 of FIGS. 1 and 2, no insulating layer 104 is above the top-most prepreg layer 104A in this arrangement, and no insulating layer 104 is below the bottom-most prepreg layer 104G. Arranging the prepreg layers 104A, 104C, 104E, and 104G in relation to the core layers 104B, 104D, and 104F in such alternating fashion results in the insulating layers 104 being interleaved among the conductive layers 102, due to the conductive layers 102B and 102C, 102D and 102E, and 102F and 102G having been previously bonded to the core layers 104B, 104D, and 104F, respectively.

It is noted that more generally, the top-most prepreg layer 104A is a top-most insulating layer 104, and the bottom-most prepreg layer 104G is a bottom-most insulating layer 104. As such, it is more generally said that no insulating layer 104 is above this top-most insulating layer 104, and no insulating layer 104 is below this bottom-most insulating layer 104. That is, there is no core layer 104 or prepreg layer 104 above the top-most insulating layer 104, which may be a core layer 104 or a prepreg layer 104. Likewise, there is no core layer 104 or prepreg layer 104 below the bottom-most insulating layer 104 in question, which may be a core layer 104 or a prepreg layer 104. In general, if the top-most insulating layer 104 is a core layer 104, then the bottom-most insulating layer 104 is also a core layer 104, as opposed to a prepreg layer 104. Likewise, if the top-most insulating layer 104 is a prepreg layer 104, then the bottom-most insulating layer 104 is also a prepreg layer 104, as opposed to a core layer 104.

The top-most conductive layer 102A is positioned above the top-most prepreg layer 104A (and, more generally, the top-most insulating layer 104), and the bottom-most conductive layer 102H is position below the bottom-most prepreg layer 104G (and, more generally, the bottom-most insulating layer 104) (408). The basic configuration of the PCB stackup 100 is thus complete. What remains to be performed is to bond the conductive layers 102 and the insulating layers 104 thereof together to complete fabrication of the stackup 100.

As such, pressure is applied between the top-most conductive layer 102A and the bottom-most conductive layer 102H, and heat is applied to the conductive layers 102 and to the insulating layers 104 (410). For instance, the PCB stackup 100 can be pinned between two heavy metal plates, and the resulting assembly placed in a heated hydraulic press for a length of time, such as two hours. As an example, the PCB stackup 100 may be exposed to a temperature of 175 degrees Celsius for this length of time, where the pressure provided by the hydraulic press is 3,000 kilograms. Thereafter, the PCB stackup 100 is removed from the hydraulic press and cooled or permitted to cool, at which time the stackup 100 can be removed from the metal plates.

Figure 5:
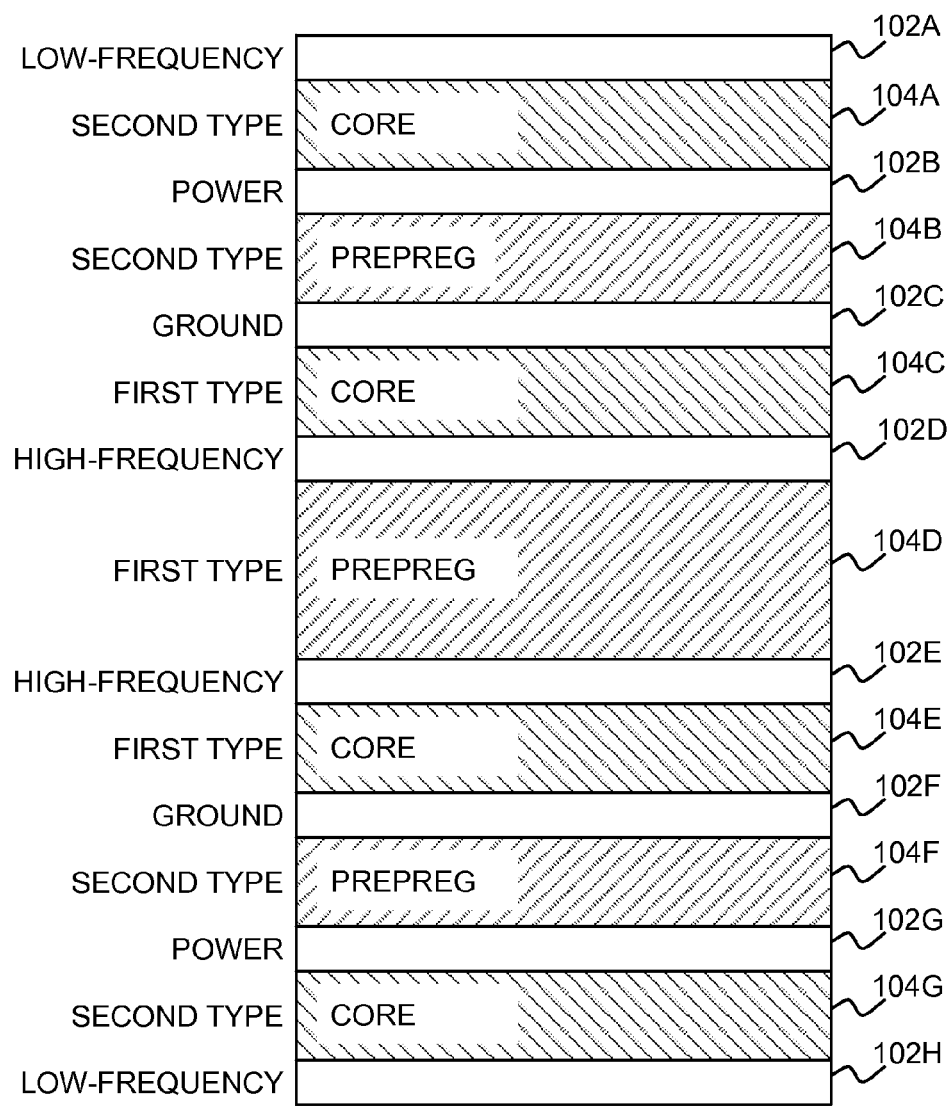
FIG. 5 is a diagram of another example PCB stackup.

The PCB stackup 100 that has been described, and which is depicted in FIGS. 1 and 2, is one example configuration of a PCB stackup 100 in accordance with the techniques disclosed herein. Other PCB stackups in accordance with the techniques disclosed herein are also possible. FIG. 5, for instance, shows another example PCB stackup 100 that has top-most and bottom-most insulating layers 104 that are core layers 104, as opposed to prepreg layers 104 as in FIGS. 1 and 2, and that has a central insulating layer 104 that is a central prepreg layer 104, as opposed to a central core layer 104 as in FIGS. 1 and 2. Furthermore, FIG. 6 shows a third example PCB stackup 100 that is more representative of a PCB stackup employed in real-world situations, and that has better impedance control than the example PCB stackups 100 of FIGS. 1-2 and 5.

In FIG. 5 more specifically, the insulating layers 104 of the PCB stackup 100 are oppositely arranged as core layers 104 and prepreg layers 104 as compared to as in FIG. 1. That is, the PCB stack 100 of FIG. 5 includes a central prepreg layer 104D as opposed to a central core layer 104D as in FIG. 1. Upwards from this layer 104D in FIG. 5, the PCB stack 100 includes a core layer 104C, a prepreg layer 104B, and a core layer 104A, interleaved with conductive layers 102D, 102C, 102B, and 102A. Downwards from the central prepreg layer 104D, the PCB stack 100 includes a core layer 104E, a prepreg layer 104F, and a core layer 104G, interleaved with conductive layers 102E, 102F, 102G, and 102H. The conductive layers 102 in the example of FIG. 5 are as in the example of FIG. 1.

As noted above, FIG. 1 is a specific example of a general case or configuration in which the core layers 104 are odd in number and the prepreg layers 104 are even in number. By comparison, FIG. 5 is a specific example of a different general case or configuration in which the core layers 104 are even in number and the prepreg layers 104 are odd in number. In both these cases, however, the conductive layers 102 are even in number and the insulating layers 104 (i.e., including both the core layers 104 and the prepreg layers 104 are odd in number).

Figure 6:
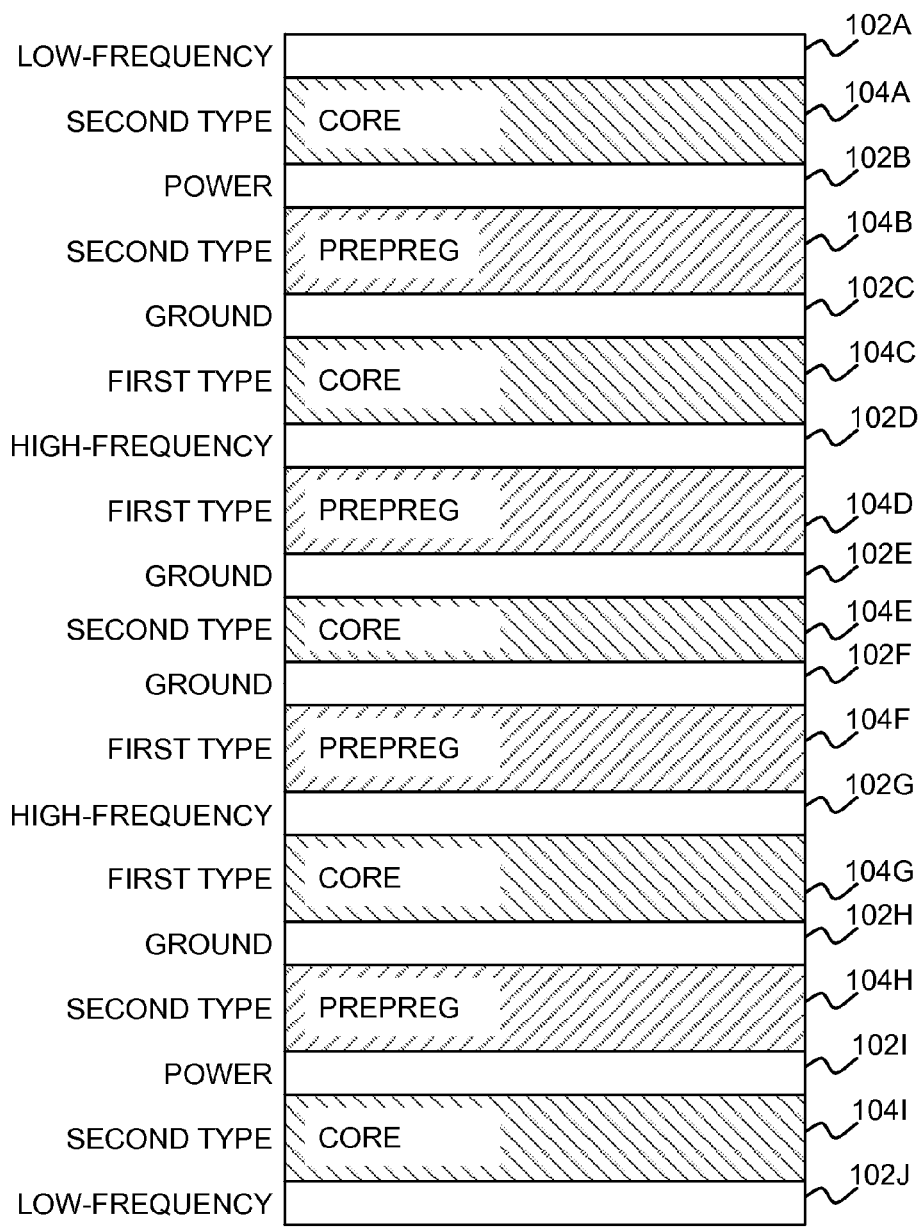
FIG. 6 is a diagram of a third example PCB stackup.

In FIG. 6 more specifically, the insulating layers 104 of the PCB stack 100 include five core layers 104A, 104C, 104E, 104G, and 104I, as compared to three core layers 104 in FIG. 1. The insulating layers 104 of the PCB stack 100 of FIG. 6 include four prepreg layers 104B, 104D, 104F, and 104H, as compared to four prepreg layers 104 in FIG. 1. Unlike the central insulating layer 104D of FIGS. 1 and 5, the central insulating layer 104E of FIG. 6 is thinner than the other insulating layers 104. The PCB stack 100 of FIG. 6 includes ten conductive layers 102A, 102B, 102C, 102D, 102E, 102F, 102G, 102H, 102I, and 102J, as compared to the eight conductive layers 104 in FIG. 1. The conductive layers 102 in FIG. 6 include low-frequency layers 102A and 102J, power layers 102B and 102I, ground layers 102C, 102E, 102F, and 102H, and high-frequency layers 102D and 102G.

In FIG. 6, the insulating layers 104C and 104D are immediately adjacent to the high-frequency layer 102D, and therefore are of the first material type. Likewise, the insulating layers 104F and 104G are immediately adjacent to the high-frequency layer 102G, and therefore is also of the first material type. By comparison, the insulating layers 104A, 104B, 104E, 104H, and 104I are not immediately adjacent to either the high-frequency layer 102D or 102G, and therefore are of the second material type. In this respect, regardless of the type, arrangement, and number of the insulating layers 104 and the conductive layers 102, an insulating layer 104 is of the second material type unless it is immediately adjacent to a high-frequency layer 102, in which case it is of the first material type. FIGS. 1-2, 5, and 6 are thus intended just to show some examples of the type, arrangement, and number of the insulating layers 104 and the conductive layers 102.

It is therefore noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. A printed circuit board (PCB) stack up comprising:
    a plurality of conductive layers comprising one or more power layers, one or more ground layers, one or more high-frequency layers over which one or more first signals having one or more first frequencies greater than a first threshold specifying a minimum high frequency are communicated, and one or more low-frequency layers over which one or more second signals having one or more second frequencies less than a second threshold are communicated, each second frequency less than each first frequency; and
    a plurality of insulating layers interleaved among the conductive layers, the insulating layers comprising one or more core layers and one or more prepreg layers arranged in alternating fashion,
    wherein each insulating layer adjacent to any of the high-frequency layers has a first material type, and each insulating layer not adjacent to any of the high-frequency layers has a second material type different than the first material type, wherein the insulating layers comprise a central insulating layer disposed in a middle of the PCB stack up and having a thickness greater than any other of the insulating layers, wherein the central insulating layer is one of the core layers or one of the prepreg layers, and wherein the PCB stack up is symmetrical about the central insulating layer.

2. The PCB stackup of claim 1, wherein for a given thickness, a given laminate construction, and a given frequency rating, the first material type has a lower dielectric constant than the second material type.

3. The PCB stackup of claim 1, wherein for a given thickness, a given laminate construction, and a given frequency rating, the first material type has a lower dielectric dissipation factor than the second material type.

4. The PCB stackup of claim 1, wherein for a given thickness, a given laminate construction, and a given frequency rating, the first material type has a lower dielectric constant and a lower dielectric dissipation factor than the second material type.

5. The PCB stackup of claim 1, wherein a configuration of the conductive layers, the insulating layers, the core layers, and the prepreg layers is one of:
  a first configuration in which the conductive layers are even in number, the insulating layers are odd in number, the core layers are odd in number, and the prepreg layers are even in number;
  a second configuration in which the conductive layers are even in number, the insulating layers are odd in number, the core layers are even in number, and the prepreg layers are odd in number.

6. The PCB stackup of claim 1, wherein the conductive layers comprise a pair of outer conductive layers including a top-most conductive layer above which no core layer or prepreg layer is disposed and a bottom-most conductive layer below which no core layer or prepreg layer is disposed.

7. The PCB stackup of claim 1, wherein no insulating layer is immediately adjacent to any other insulating layer, and no conductive layer is immediately adjacent to any other conductive layer.

8. A method for fabricating a printed circuit board (PCB) stackup, comprising:
  providing one or more core layers of a plurality of insulating layers where each core layer has a conductive layer of a plurality of conductive layers attached to each side thereof;
  arranging a plurality of prepreg layers of the insulating layers in relation to the core layers in alternating fashion such that the insulating layers are interleaved among the conductive layers;
  positioning a top-most conductive layer of the conductive layers above a top-most insulating layer of the insulating layers, and a bottom-most conductive layer of the conductive layers below a bottom-most insulating layer of the insulating layers; and
  applying pressure between the top-most conductive layer and the bottom-most conductive layer and applying heat to the insulating layers and the conductive layers to bind the insulating layers and the conductive layers to one another, resulting in the PCB stackup being fabricated,
  wherein the conductive layers comprise one or more power layers, one or more ground layers, one or more high-frequency layers over which one or more first signals having one or more first frequencies greater than a first threshold specifying a minimum high frequency are communicated, and one or more low-frequency layers over which one or more second signals having one or more second frequencies less than a second threshold specifying a maximum low frequency are communicated, each second frequency less than each first frequency,
  and wherein each insulating layer adjacent to any of the high-frequency layers has a first material type, and each insulating layer not adjacent to any of the high-frequency layers has a second material type different than the first material type.

9. The method of claim 8, wherein for a given thickness, a given laminate construction, and a given frequency rating, the first material type has a lower dielectric constant than the second material type.

10. The method of claim 8, wherein for a given thickness, a given laminate construction, and a given frequency rating, the first material type has a lower dielectric dissipation factor than the second material type.

11. The method of claim 8, wherein for a given thickness, a given laminate construction, and a given frequency rating, the first material type has a lower dielectric constant and a lower dielectric dissipation factor than the second material type.

12. The method of claim 8, wherein each core layer is a cured fiberglass-epoxy resin layer having one of the conductive layers bonded to each side thereof,
  and wherein each prepreg layer is an uncured fiberglass-epoxy resin layer that is cured upon application of the pressure and the heat.

13. The method of claim 8, wherein each prepreg layer is a fiber-weave layer preimpregnated with a resin bonding agent,
  and wherein each core layer is a fiberglass reinforced epoxy laminate layer.

14. The method of claim 8, wherein each conductive layer is a copper foil layer.

15. The method of claim 8, wherein a configuration of the conductive layers, the insulating layers, the core layers, and the prepreg layers is one of:
  a first configuration in which the conductive layers are even in number, the insulating layers are odd in number, the core layers are odd in number, and the prepreg layers are even in number;
  a second configuration in which the conductive layers are even in number, the insulating layers are odd in number, the core layers are even in number, and the prepreg layers are odd in number.

16. The method of claim 8, wherein the insulating layers comprise a central insulating layer disposed in a middle of the PCB stackup and having a thickness greater than any other of the insulating layers,
  wherein the central insulating layer is one of the core layers or one of the prepreg layers,
  and wherein the PCB stackup is symmetrical about the central insulating layer.

17. The method of claim 8, wherein no insulating layer is immediately adjacent to any other insulating layer, and no conductive layer is immediately adjacent to any other conductive layer.

18. A method comprising:
  providing a printed circuit board (PCB) stackup comprising a plurality of conductive layers and a plurality of insulating layers interleaved among the conductive layers, the insulating layers comprising one or more core layers and one or more prepreg layers arranged in alternating fashion; and
  attaching one or more electronic components to the PCB stackup to fabricate an electronic device comprising the PCB stackup and the electronic components, wherein the conductive layers comprise one or more power layers, one or more ground layers, one or more high-frequency layers over which one or more first signals having one or more first frequencies greater than a first threshold specifying a minimum high frequency are communicated, and one or more low-frequency layers over which one or more second signals having one or more second frequencies less than a second threshold specifying a maximum low frequency are communicated, each second frequency less than each first frequency, and wherein each insulating layer adjacent to any of the high-frequency layers has a first material type, and each insulating layer not adjacent to any of the high-frequency layers has a second material type different than the first material type.

19. An electronic device comprising:

a printed circuit board (PCB) stackup comprising a plurality of conductive layers and a plurality of insulating layers interleaved among the conductive layers, the insulating layers comprising one or more core layers and one or more prepreg layers arranged in alternating fashion; and one or more electronic components attached to the PCB stackup, wherein the conductive layers comprise one or more power layers, one or more ground layers, one or more high-frequency layers over which one or more first signals having one or more first frequencies greater than a first threshold specifying a minimum high frequency are communicated, and one or more low-frequency layers over which one or more second signals having one or more second frequencies less than a second threshold specifying a maximum low frequency are communicated, each second frequency less than each first frequency, and wherein each insulating layer adjacent to any of the high-frequency layers has a first material type, and each insulating layer not adjacent to any of the high-frequency layers has a second material type different than the first material type.

* * * * *